(12) United States Patent
Cheng

(10) Patent No.: US 7,468,885 B2
(45) Date of Patent: Dec. 23, 2008

(54) COOLING DEVICE FOR INTERFACE CARD

(75) Inventor: Chia-Chun Cheng, Chung-Ho (TW)

(73) Assignee: Cooler Master Co., Ltd., Taipei (TW)

(*) Notice: Subject to any disclaimer, the term of this patent is extended or adjusted under 35 U.S.C. 154(b) by 0 days.

(21) Appl. No.: 11/748,563

(22) Filed: May 15, 2007

(65) Prior Publication Data

US 2007/0285900 A1 Dec. 13, 2007

(30) Foreign Application Priority Data

Jun. 9, 2006 (TW) ............................ 95210096 U

(51) Int. Cl.
*H05K 7/20* (2006.01)
*H01L 23/36* (2006.01)
(52) U.S. Cl. .............. 361/699; 361/700; 361/719; 361/720; 165/80.3; 165/80.4; 165/104.21; 257/714; 62/259.2
(58) Field of Classification Search ............ 361/687, 361/690–697, 700–714, 717–724; 165/80.3, 165/80.4, 80.5, 104.19, 104.21, 104.33, 121–126, 165/185; 257/713–722, 726; 62/259.2; 174/15.1, 174/15.2, 16.1, 16.3, 252
See application file for complete search history.

(56) References Cited

U.S. PATENT DOCUMENTS

| | | | | |
|---|---|---|---|---|
| 6,452,797 B1 * | 9/2002 | Konstad | ..................... | 361/695 |
| 6,587,343 B2 * | 7/2003 | Novotny et al. | ............. | 361/698 |
| 6,657,269 B2 * | 12/2003 | Migliorato et al. | .......... | 257/414 |
| 6,671,177 B1 * | 12/2003 | Han | ........................... | 361/719 |
| 6,717,811 B2 * | 4/2004 | Lo et al. | ..................... | 361/698 |
| 6,795,315 B1 * | 9/2004 | Wu et al. | ..................... | 361/695 |
| 7,002,797 B1 * | 2/2006 | Wittig | ........................ | 361/695 |
| 7,151,667 B2 * | 12/2006 | Walters et al. | ............. | 361/699 |
| 7,254,025 B2 * | 8/2007 | Baldwin, Jr. | ................ | 361/700 |
| 7,339,792 B2 * | 3/2008 | Han | ........................... | 361/719 |
| 7,365,989 B2 * | 4/2008 | Peng et al. | .................. | 361/720 |
| 2005/0061477 A1 * | 3/2005 | Mira | ......................... | 165/80.3 |
| 2007/0125522 A1 * | 6/2007 | Stefanoski | ............. | 165/104.21 |

* cited by examiner

*Primary Examiner*—Michael V Datskovskiy

(57) ABSTRACT

A cooling device for interface card for cooling a heating component on an interface card includes a heat sink and a water cooling head, wherein the heat sink has a heat conducting seat and a plurality of cooling fins. A cooling flow path is formed between any two adjacent cooling fins. In addition, the water block is attached onto the plural cooling fins of the heat sink. Thereby, the operational heat, generated from the heating element, is firstly absorbed by the heat-conducting seat and is then distributed uniformly cross to the plural fins. In addition to the heat dissipation proceeded between the fins and the ambient air, the operational heat is further conducted to the water block, undergoing a heat exchange with the coolant flowing in the water block, and thus a desired cooling effectiveness is achieved.

9 Claims, 7 Drawing Sheets

COOLING DEVICE FOR INTERFACE CARD

BACKGROUND OF THE INVENTION

1. Field of the Invention

The present invention generally relates to a cooling device, in particular, to a cooling structure arranged on an interface card.

2. Description of Prior Art

All electronic devices, basically, are objects capable of generating heat, which on the other hand are incurred the heat dissipating and overheating problems. The device will shutdown or work unstably, or its electronic components will even be burned out and unable to operate, when an overheating problem is occurred.

Currently, there are two trends for the development of the all electronic devices: the first one is to increase the function and to promote the working efficiency; the other one is to reduce the size and the weight as smaller and as lighter as possible. In order to achieve these two targets simultaneously, in terms of current IC technique, the transistor density and the working frequency of IC must be increased continuously, with respect to the increase of function and the promotion of working efficiency. As a result, it requires higher power, which consumes more electricity and generates more heat. On the other hand, the smaller size and the lighter weight of an electronic product mean that its internal space will be further crowded, making the handling of heat dissipating problem be more difficult. Among the all causes, the "heat" is a major factor to damage electronic components, so how to avoid "heat" becomes a bottleneck for the future development of high density IC. In other words, it becomes a very important issue for solving the heat-dissipating problem incurred in IC industry.

The so-called "cooling" is to dissipate the heat generated by any device. General speaking, there are two kinds of methods, commonly seen in market, for getting rid of the heat generated by the interface card of a personal computer; namely, one is air-cooling heat sink and the other is water-cooling heat sink. The former one adopts a fan for dissipating heat generated by a chip, wherein forcedly cool air is applied for reaching the cooling effectiveness of the chip. The advantages of this kind of method are that the working fluid is easily obtained and the manufacturing cost is low. For example, the fin-type cooler made of metallic materials not only can significantly increase the cooling area, but also can accumulate the heat generated by the interface card. Then, the heat distributed cross the fin is carried away by the forced convection effected by the fan, and thus the heat generated by the chip of an interface card may be removed effectively. However, the heat-dissipating efficiency of such kind of air-cooling heat sink is usually insufficient, in particular, in the tropical area, due to the high ambient temperature.

On the other hand, a water-cooling heat sink commonly takes a shell-tube heat exchanger as a mainly designing body to carry away the heat generated from a heat source by making a heat exchange indirectly therewith, wherein water having high heat capacity is employed. However, if the heat exchanger connected onto the interface card is poorly design, it may incur a misgiving that an accident water leakage may damage the electronic component disposed upon the interface card. A container has to be arranged in the mainframe for such heat sink for accommodating water. The contour design of this container still requires sufficient cooling ability, such that a material having high heat capacity is provided for this kind of heat dissipation. However, under a long time operation, which in turn creates high temperature circumstance, the cooling ability of this kind of heat sink will be still notably degraded, due to the continuous raise of water temperature.

SUMMARY OF THE INVENTION

Regarding aforementioned drawbacks, the main objective of the present invention is to provide a cooling structure for an interface card, which comprises two cooling modes: the air-cooling mode and the water-cooling mode, and which may enhance the cooling efficiency for the interface card through a double cooling mechanisms: the heat sink and the water block.

To achieve above objectives, the present invention provides a cooling device for interface card for cooling the heating component arranged thereon. The structure of the cooling device mainly consists of a heat sink and a water block, wherein the heat sink has a heat conducting seat and a plurality of cooling fins. A cooling flow path is formed between any two adjacent cooling fins. In addition, the water block is attached onto the plural cooling fins of the heat sink. Thereby, the operational heat, generated from the heating element, is firstly absorbed by the heat-conducting seat and is then distributed uniformly cross to the plural fins. In addition to the heat dissipation proceeded between the fins and the ambient air, the operational heat is further conducted to the water block for undergoing a heat exchange with the coolant flowing in the water block, and thus a desired cooling effectiveness is achieved.

BRIEF DESCRIPTION OF DRAWING

The features of the invention believed to be novel are set forth with particularity in the appended claims. The invention itself, however, may be best understood by reference to the following detailed description of the invention, which describes several exemplary embodiments of the invention, taken in conjunction with the accompanying drawings, in which:

DETAILED DESCRIPTION OF THE INVENTION

In cooperation with attached drawings, the technical contents and detailed description of the present invention will be as follows.

Figure 1:
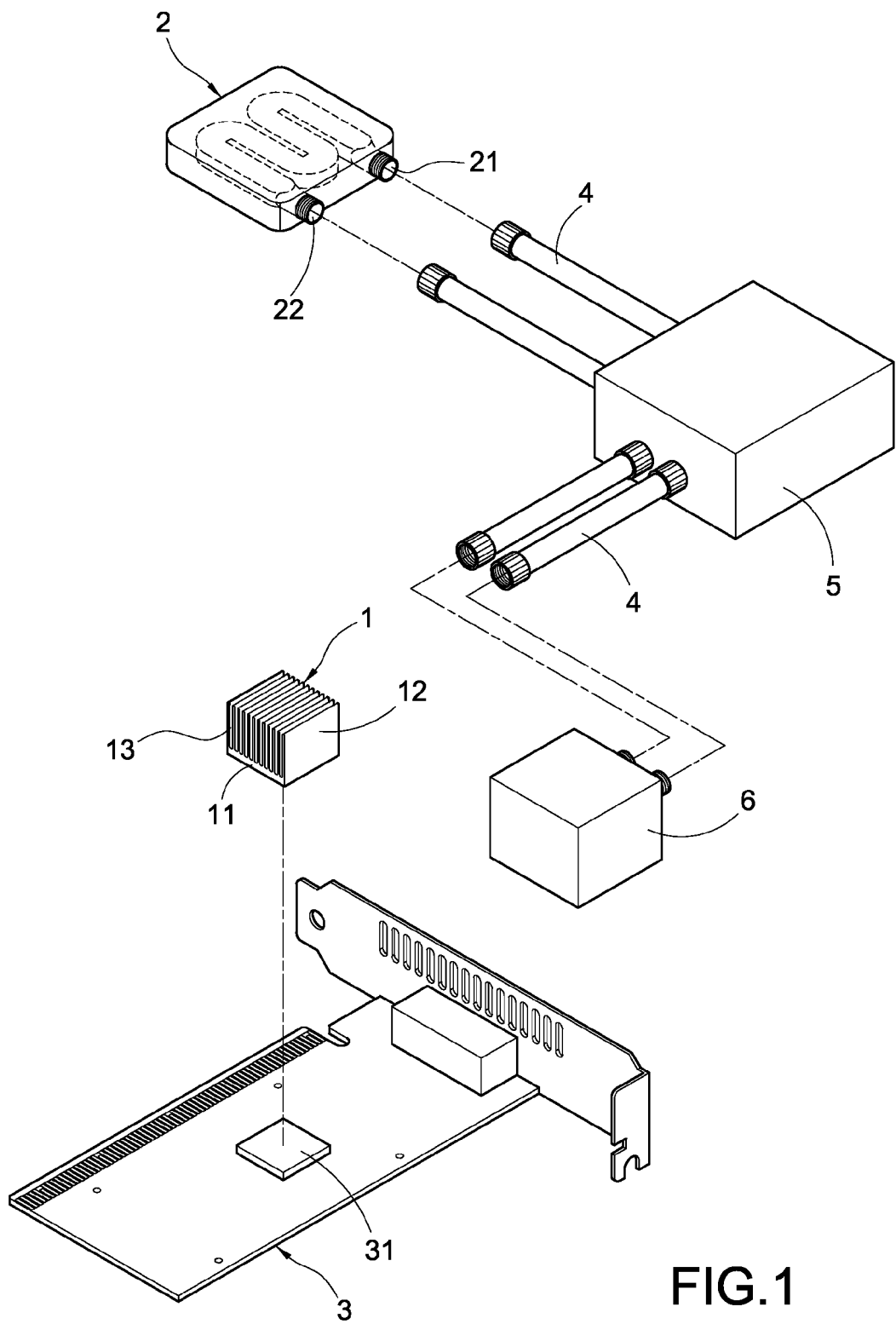
FIG. 1 is an explosive illustration showing the perspective structure according to the present invention.
Figure 2:
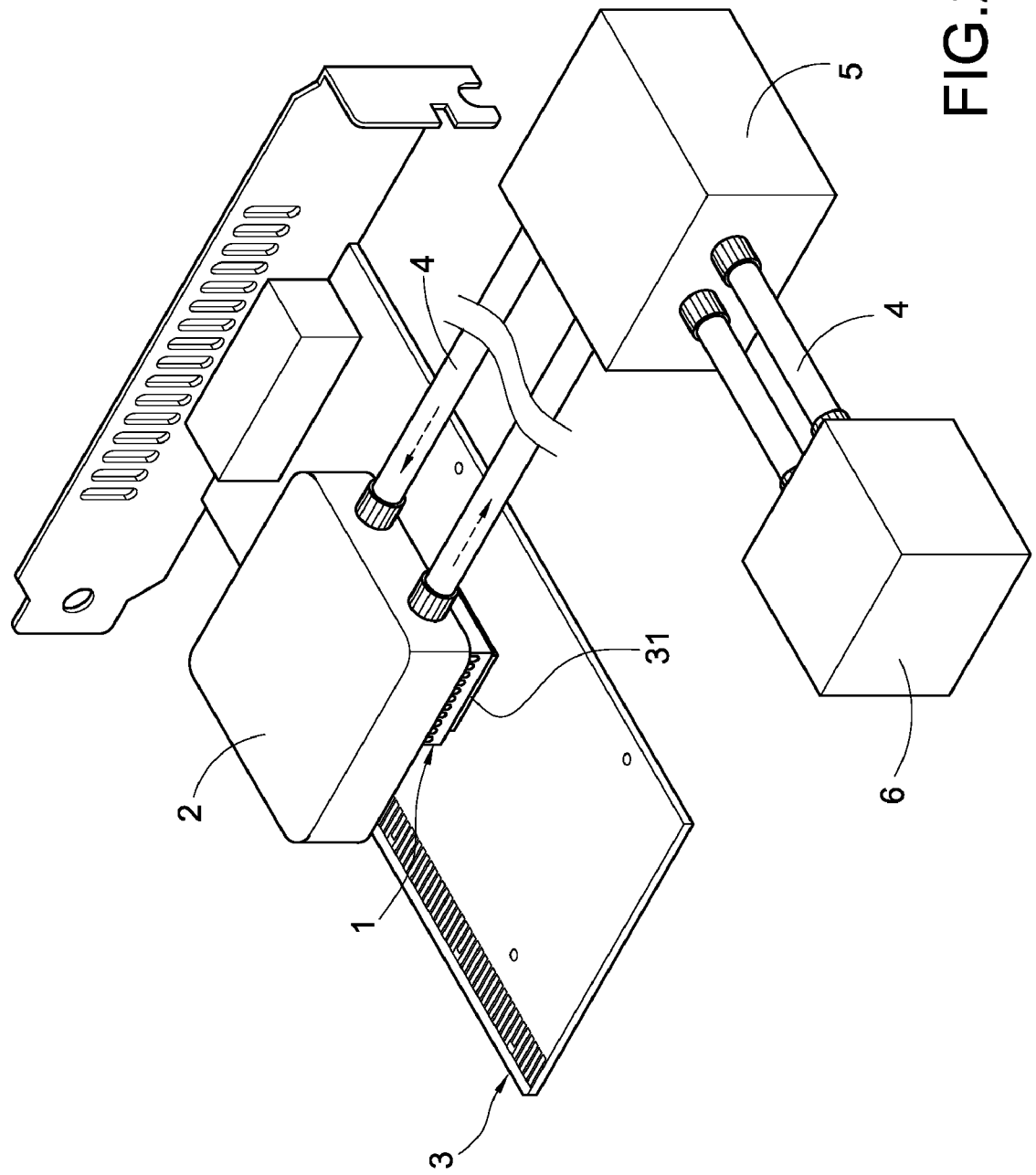
FIG. 2 is a perspective assembling view according to the present invention.
Figure 7:
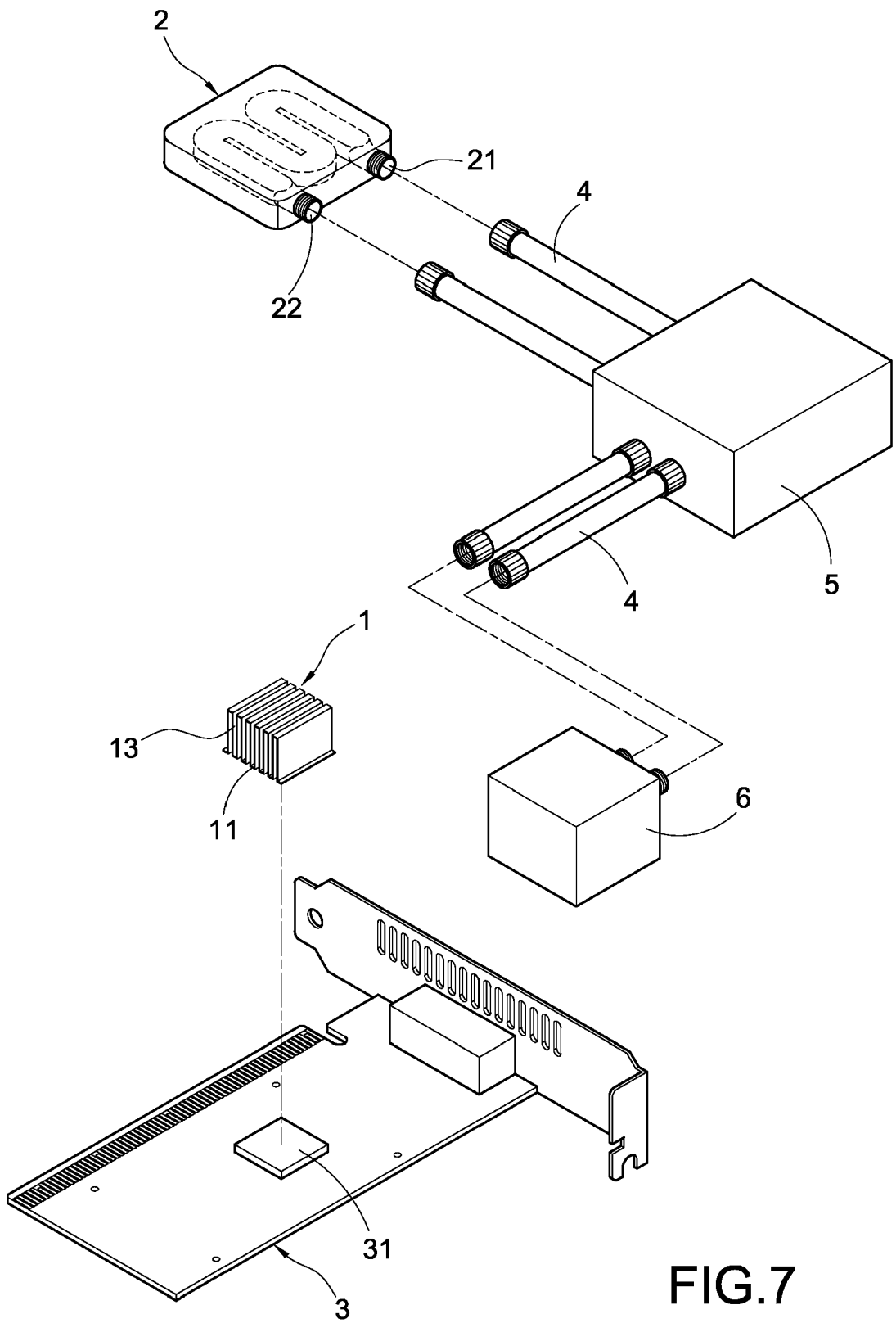
FIG. 7 is a structural illustration showing another embodiment of the heat sink according to the present invention.

Please refer to FIG. 1 and FIG. 2, which respectively are perspective structural explosive illustration and perspective assembling view of a preferable embodiment according to the present invention, main structure of which is comprised of a heat sink 1 and a water block 2, wherein the heat sink 1 has a heat-conducting seat 11 and a plurality of cooling fins 12 formed thereon. The heat-conducting seat 11 is directly attached on a heating component 31 of an interface card, and a cooling flow path 13 is formed between any two adjacent cooling fins 12. On the other hand, a water block 2, which is attached on the heat sink 1, has a water inlet 21 and a water outlet 22, and in which a winding route is provided for circulating the coolant (which belongs to the prior arts, being not repetitiously described herein). In the meantime, the water inlet 21 and the water outlet 22 of the water block 2 are respectively interconnected with a pump 5 via a conduit 4, through which the pump 5 is also communicated with an accommodating tank 6, all of which belong to the prior arts, being not repetitiously described herein. In addition, the aforementioned heat sink 1 may also be an aluminum extrusion-molded heat sink 1, as shown in FIG. 7.

Figure 3:
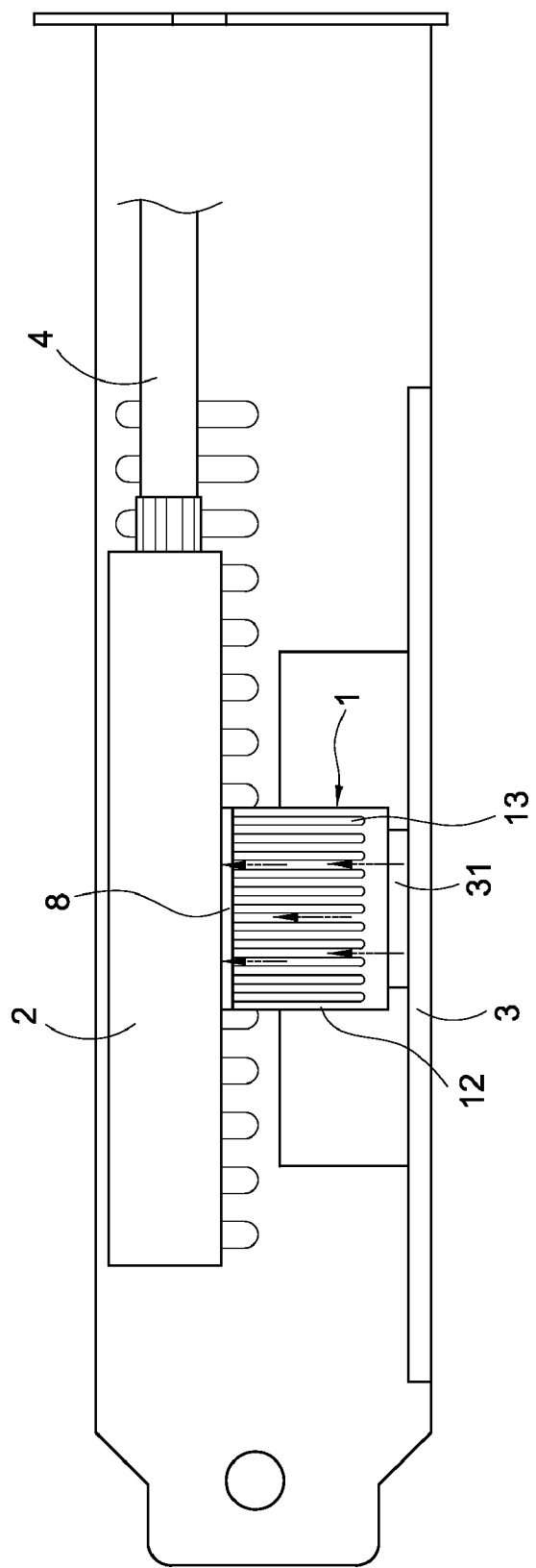
FIG. 3 is a sectional view illustrating the operation according to the present invention.

Please refer to FIG. 3, being a sectional view showing the operation of the present invention. After being generated by the heating component 31 on the interface card 3, the operational heat, directly absorbed by the heat-conducting seat 11 via a heat-conducting procedure, is further conducted cross the plural cooling fins 12 arranged on the heat-conducting heat 11, in the meantime, being heat exchanged with the ambience for undergoing an air-cooling process. Furthermore, the operational heat, conducted from the heat-conducting seat 11 to the plural cooling fins 12, is further conducted upwardly toward the water block 2 attached with the plural cooling fins 12, (directions of which are same as those of the arrows shown in the figure). The operational heat, absorbed by the water block 2, is further undergone a heat-exchanging operation with the coolant circulated therein, afterwards, the heat being carried away by the coolant, and thus the cooling operation for the interface card is significantly enhanced.

Figure 4:
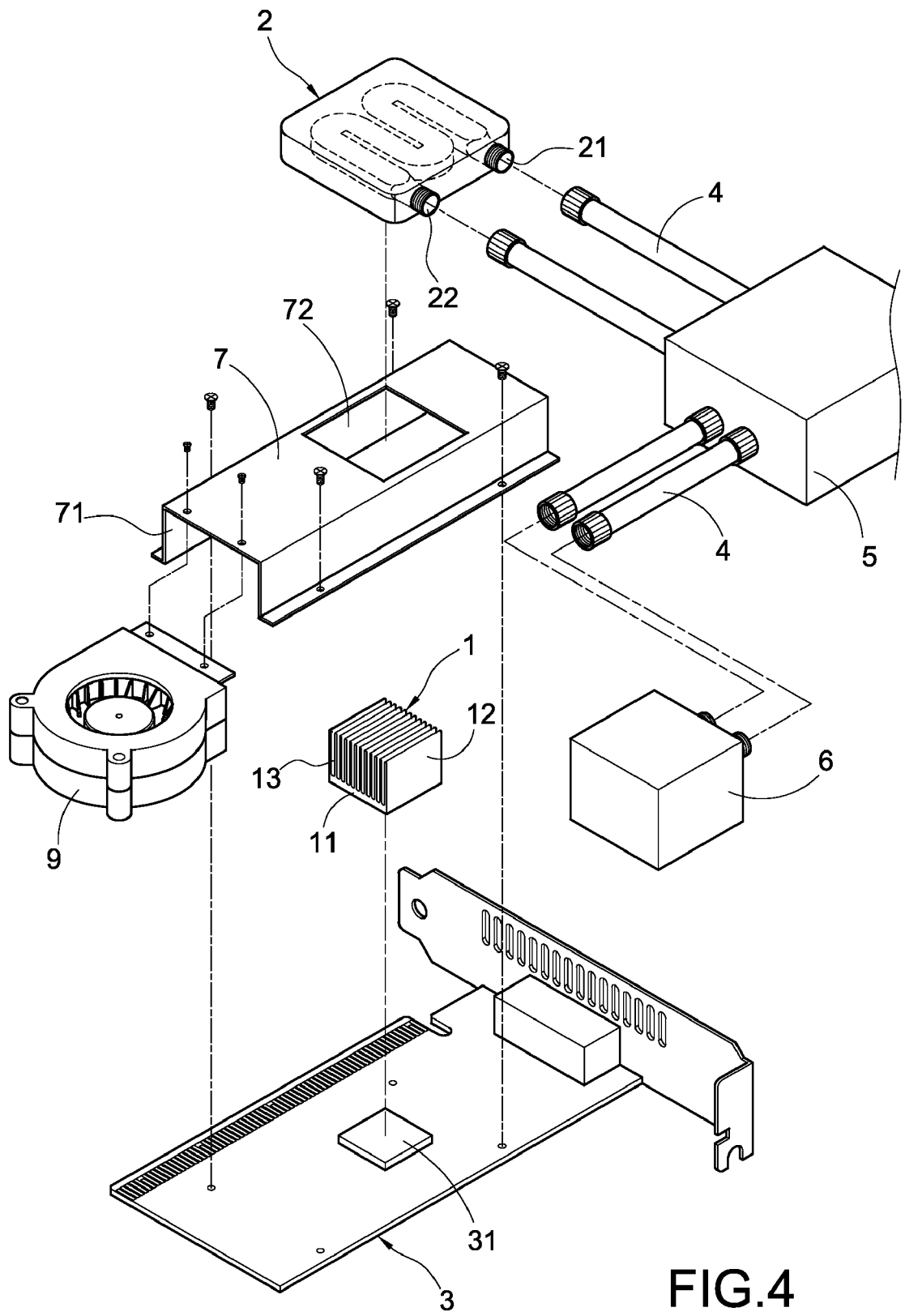
FIG. 4 is an explosive illustration showing the perspective structure of another embodiment according to the present invention.
Figure 5:
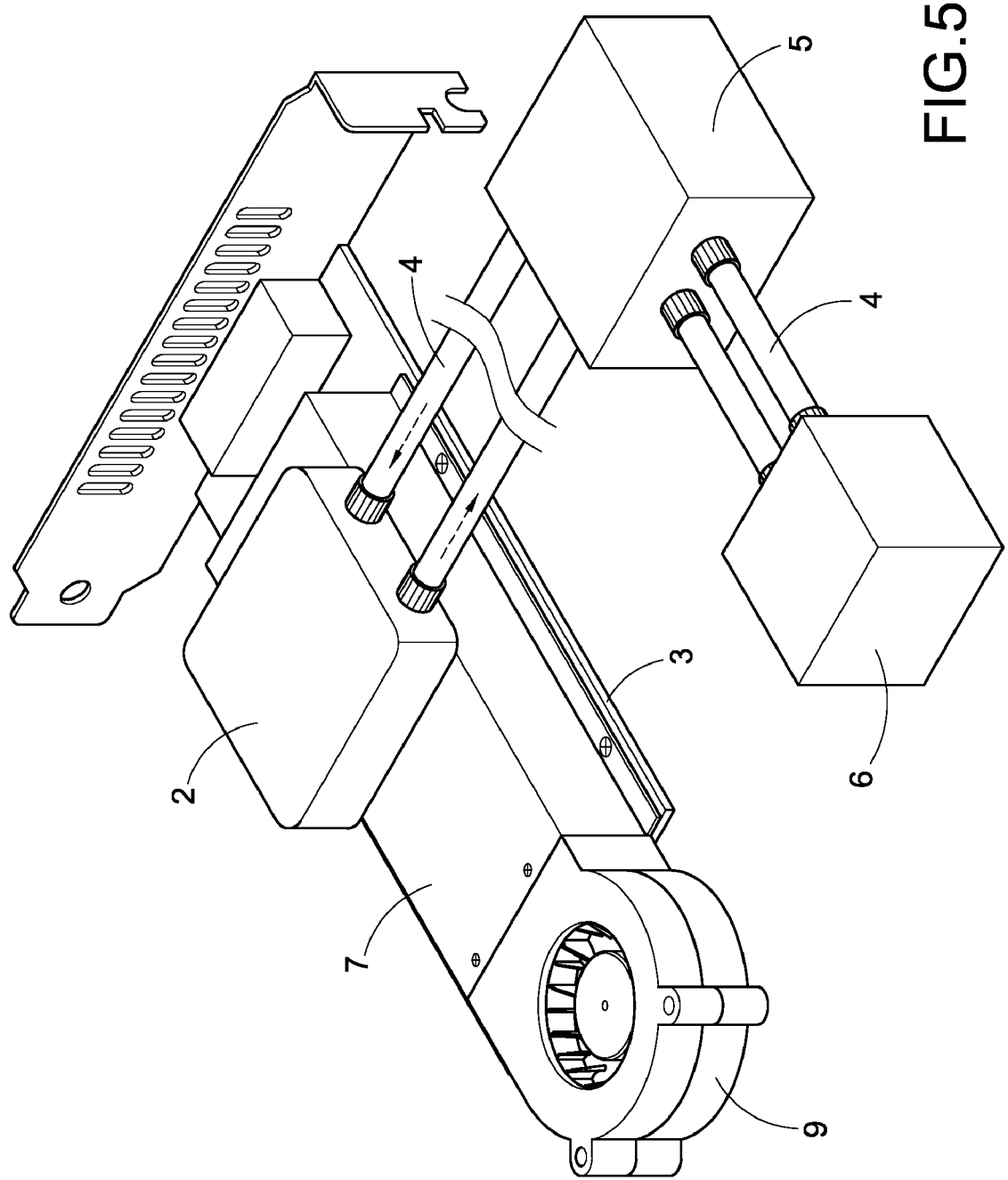
FIG. 5 is a perspective assembling view of another embodiment according to the present invention.
Figure 6:
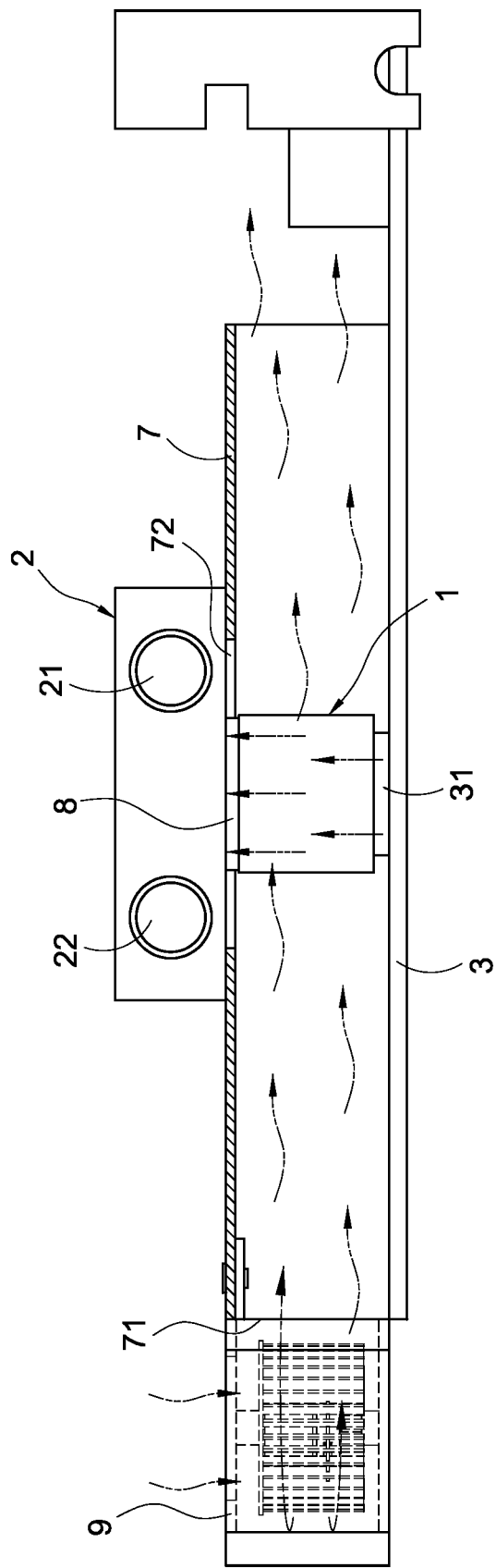
FIG. 6 is a sectional view illustrating the operation of another embodiment according to the present invention.

Please refer to FIG. 4 and FIG. 5, respectively showing a perspective structural explosive illustration and a perspective assembling view of another preferable embodiment according to the present invention. It may be noted that a hood 7, further arranged over the interface card 3, is formed as a reverse-U shape, its two sides further respectively being arranged an opening 71, while a through groove 72, arranged on top of the hood 7, is positioned directly with respect to the position of the heat sink 1 so that, after being connected to the interface card 3, the hood 7 houses the heat sink 1, the plural cooling fins 12 of which, in the meantime, are just explored out of the hood 7 via the through groove 72 in a way, such that the water block 2 may be directly attached to the heat sink 1. In addition, in order to promote the heat-conducting efficiency between the heat sink 1 and the water block 2, a heat-conducting medium 8 may also be provided between the water block 2 and the heat sink 1, such as a solder paste or a thermal conductive adhesive for example, as shown in FIG. 6. Additionally, a centrifugal fan 9 is arranged at one opening 71 of the hood 7, and the blowing direction of the fan 9 is parallel to the directions of the cooling flow paths 13 formed in the heat sink 1, so the air in the hood 7 may be accelerated forcedly and quickly.

Please refer to FIG. 6, showing a sectional illustration of the operation of another embodiment according to the present invention. After being generated by a heating component 31 on an interface card 3, the operational heat, which is firstly absorbed by a heat-conducting seat 11 of a heat sink 1, is then distributed cross a plurality of plural cooling fins 12 and is undergone a heat-exchanging operation with the air that is generated by the fan 9 and runs quickly along the hood 7, and thus the forced air carries the absorbed heat out of the heat sink 1 through the cooling flow paths 13 (the directions of which are same as those of the arrows shown in the figure), and finally exits another opening 13 of the hood 7, the air-cooling efficiency of the heat sink 1 being thereby enhanced.

Aforementioned description is only preferable embodiments according to the present invention, being not used to limit its executing scope. Any equivalent variation and modification made according to appended claims is all covered by the claims claimed by the present invention.

What is claimed is:

1. A cooling device for interface card, for reducing the high temperature generated by a heating component of an interface card, comprising:
    a heat sink, having a heat conducting seat and a plurality of cooling fins formed thereon, the heat conducting seat being attached onto the heating component;
    a water block, attached to the heat sink, and having a water inlet and a water outlet, for provision of coolant flowing in and flowing out the water block; and
    a hood, which is connected to the interface card and houses the heat sink therein, and on top of which a through groove, corresponding to a position of the heat sink, is arranged in a way, such that the plurality of cooling fins are just explored out the through groove.

2. The cooling device for interface card according to claim 1, wherein the heat sink is an aluminum extrusion-molded heat sink.

3. The cooling device for interface card according to claim 1, wherein a cooling flow path is respectively formed between any two adjacent cooling fins of the heat sink.

4. The cooling device for interface card according to claim 1, wherein a heat conducting medium is arranged between the heat sink and the water block.

5. The cooling device for interface card according to claim 4, wherein the heat conducting medium is a solder paste.

6. The cooling device for interface card according to claim 4, wherein the heat conducting medium is a thermal conductive paste.

7. The cooling device for interface card according to claim 1, wherein two openings are respectively arranged at two sides of the hood.

8. The cooling device for interface card according to claim 7, further including a fan, arranged at one opening of the hood.

9. The cooling device for interface card according to claim 8, wherein an air flowing direction of the fan is parallel to the cooling flow path of the heat sink.

* * * * *